(12) United States Patent
Ryu

(10) Patent No.: US 7,723,177 B2
(45) Date of Patent: May 25, 2010

(54) METHOD OF MANUFACTURING SEMICONDUCTOR DEVICE

(75) Inventor: Sang-Wook Ryu, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 14 days.

(21) Appl. No.: 12/142,872

(22) Filed: Jun. 20, 2008

(65) Prior Publication Data
US 2008/0318391 A1    Dec. 25, 2008

(30) Foreign Application Priority Data
Jun. 22, 2007    (KR) ...................... 10-2007-0061466

(51) Int. Cl.
*H01L 21/8238*    (2006.01)
(52) U.S. Cl. ..................................... 438/221
(58) Field of Classification Search ................. 438/221, 438/246, 445, 692; 257/E21.549, E21.551
See application file for complete search history.

(56) References Cited

U.S. PATENT DOCUMENTS 6,030,898 A * 2/2000 Liu ............................ 438/692
6,624,016 B2 * 9/2003 Wu ............................ 438/221
6,746,936 B1 * 6/2004 Lee ............................ 438/445

* cited by examiner

*Primary Examiner*—Calvin Lee
(74) *Attorney, Agent, or Firm*—Sherr & Vaughn, PLLC

(57) ABSTRACT

A method of manufacturing a semiconductor device that may include steps of forming a pad oxide layer and an insulating layer on a semiconductor substrate; and then performing a first etching process on the semiconductor device to form an insulating layer pattern exposing a portion of the pad oxide layer in a trench area; and then performing a second etching process with respect to the pad oxide layer by using the insulating layer pattern as a mask; and then performing a blanket ion implantation process with respect to the insulating layer pattern and the exposed portion of the pad oxide layer to form an ion layer in the semiconductor substrate; and then performing a third etching process with respect to the semiconductor substrate to simultaneously form a pad oxide layer pattern and a trench in the semiconductor substrate; and then forming an insulating layer on the semiconductor substrate including the trench; and then performing a planarization process with respect to the semiconductor substrate including the insulating material and removing the pad oxide layer pattern and the insulating layer pattern, thereby forming an isolation layer in the trench.

19 Claims, 7 Drawing Sheets

METHOD OF MANUFACTURING SEMICONDUCTOR DEVICE

Figure 1:
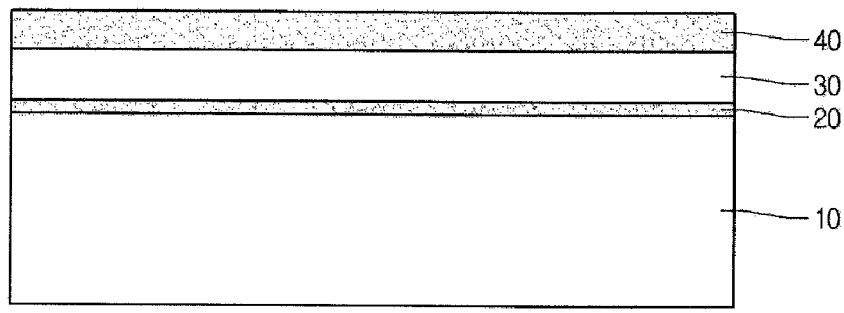

The present application claims priority under 35 U.S.C. 119 and 35 U.S.C. 365 to Korean Patent Application No. 10-2007-0061466 (filed on Jun. 22, 2007), which is hereby incorporated by reference in its entirety.

BACKGROUND

As semiconductor devices have become highly integrated, the size of a memory cell has been scaled down. Therefore, it is necessary to minimize the size of an isolation area. However, since the size of the isolation area is restricted due to a process of forming the isolation area and the arrangement of structures in a memory array, there are limitations in the reduction of the size of the isolation area. Accordingly, the isolation layer has been formed through a shallow trench isolation (STI) process providing a superior isolation characteristic with a narrow width instead of a local oxidation of silicon (LOCOS) process having a problem such as birds beak. In the STI process, a chemical mechanical polishing (CMP) may be performed after forming a trench in a semiconductor substrate and filling the trench with an oxide layer. However, when the isolation layer is formed through the STI process, an electric field may be concentrated on the edge of the isolation layer, so that an undesirable transistor is formed to exert an influence on the characteristic of a device.

SUMMARY

Embodiments relate to a method of manufacturing a semiconductor device that may include at least one of the following steps: forming a pad oxide layer and an insulating layer on and/or over a semiconductor substrate; and then forming an insulating layer pattern which exposes a portion of the pad oxide layer in a trench area through a first etching process on the semiconductor device; and then performing a second etching process with respect to the pad oxide layer using the insulating layer pattern as a mask; and then forming an ion layer on and/or over the semiconductor substrate by performing a blanket ion implantation with respect to the insulating layer pattern and the pad oxide layer; and then forming a pad oxide layer pattern and a trench by performing a third etching process with respect to the semiconductor substrate; and then providing an insulating material on and/or over the semiconductor substrate including the trench; and then performing a planarization process with respect to the semiconductor substrate including the insulating material; and then removing the pad oxide layer pattern and the insulating layer pattern, thereby forming an isolation layer.

Embodiments relate to a method that may include at least one of the following steps: sequentially forming a first oxide layer, a nitride layer and a second oxide layer on a semiconductor substrate; and then performing a first etching process to expose a portion of the semiconductor substrate to thereby form a first oxide layer pattern, a nitride layer pattern and a second oxide layer pattern on the semiconductor substrate; and then forming a third oxide layer on the semiconductor substrate including the first oxide layer pattern, the nitride layer pattern and the third oxide layer pattern; and then performing a second etching process to expose a portion of the semiconductor substrate to thereby form a spacer on sidewalls of the first oxide layer pattern, the nitride layer pattern and the third oxide layer pattern; and then performing an ion implantation process using the second oxide layer pattern and the spacer as masks to thereby form an ion layer in the semiconductor substrate; and then performing a third etching process to thereby form a trench in the semiconductor substrate, wherein the depth of trench is adjusted using the ion layer; and then forming a fourth oxide layer on the semiconductor substrate and in the trench and also on sidewalls of the first oxide layer pattern, the nitride layer pattern and the second oxide layer pattern; and then performing as fourth etching process to thereby remove the first oxide layer pattern, the nitride layer pattern and the second oxide layer pattern; and then performing a cleaning process with respect to the semiconductor substrate.

Embodiments relate to a method that may include at least one of the following steps: sequentially forming a first oxide layer, a nitride layer and a second oxide layer on a semiconductor substrate; and then performing a first etching process to expose a portion of the first oxide layer and thereby form a nitride layer pattern and a second oxide layer pattern on the semiconductor substrate; and then performing an ion implantation process to form an ion layer at a predetermined depth in the semiconductor substrate; and then performing a second etching process using ions from the ion layer as an etching gas to thereby form a trench in the semiconductor substrate and a first oxide layer pattern; and then removing the second oxide layer pattern; and then forming a third oxide layer on the semiconductor substrate and in the trench and also on sidewalls of the first oxide layer pattern and the nitride layer pattern; and then performing as third etching process to thereby remove the first oxide layer pattern and the nitride layer pattern; and then performing a cleaning process with respect to the semiconductor substrate.

DRAWINGS

Example FIGS. 1 to 15 illustrate a method of manufacturing a semiconductor device, in accordance with embodiments.

DESCRIPTION

In the description of an embodiment, when a layer is referred to as being "on/over" another layer, it can be directly "on/over" the other layer, or intervening layers may also be present. The thickness and size of each layer shown in the drawings can be simplified or exaggerated for the purpose of convenience or clarity. In addition, the size of each element may be reduced or magnified from the real size thereof.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

As illustrated in example FIG. 1, a method of manufacturing a semiconductor device in accordance with embodiments may include sequentially forming pad oxide layer 20, nitride layer 30 and first oxide layer 40 on and/or over semiconductor substrate 10. Pad oxide layer 20 may have a thickness in the range of between 30 to 500 Å, nitride layer 30 may have a thickness in the range of between 500 to 3000 Å and first oxide layer 40 may have a thickness in the range of between 300 to 2000 Å. Pad oxide layer 20 may serve to protect elements formed on and/or over semiconductor device 10. Nitride layer 30 may be composed of at least one of an SiN layer and an oxynitride layer.

Figure 2:
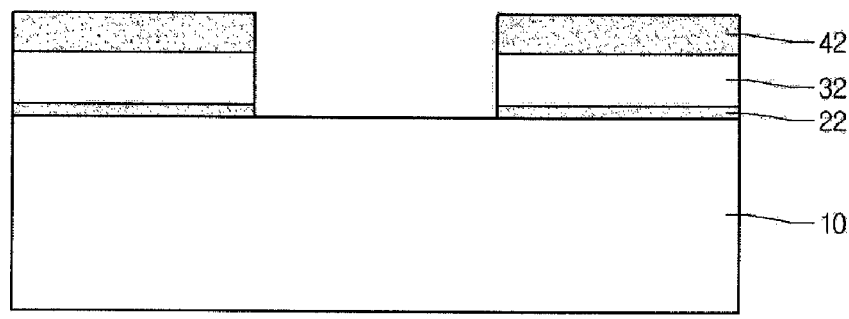

As illustrated in example FIG. 2, after forming a photoresist pattern on and/or over semiconductor substrate 10 including pad oxide layer 20, nitride layer 30 and first oxide layer 40, an etching process is performed with respect to the resultant structure, thereby forming first oxide layer pattern 42, nitride pattern 32 and pad oxide layer pattern 22. The etching process may be performed by injecting a mixture gas including $C_xH_yF_z$ gas as a main etching gas and at least one of $SF_6$, $Cl_2$, $N_2$, $O_2$, HBr, Ar and He as an additive gas.

Figure 3:
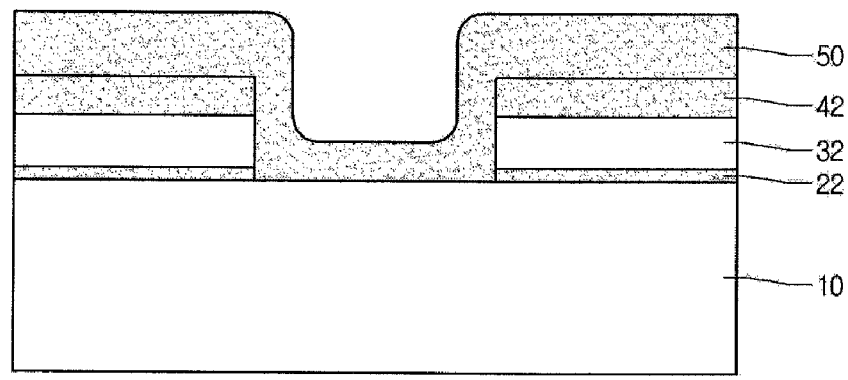

As illustrated in example FIG. 3, second oxide layer 50 may then be formed on and/or over semiconductor substrate 10 including first oxide layer pattern 42, nitride pattern 32, and pad oxide layer pattern 22. Second oxide layer 50 may be composed of the same material as that of first oxide layer pattern 42 and pad oxide layer pattern 22.

Figure 4:
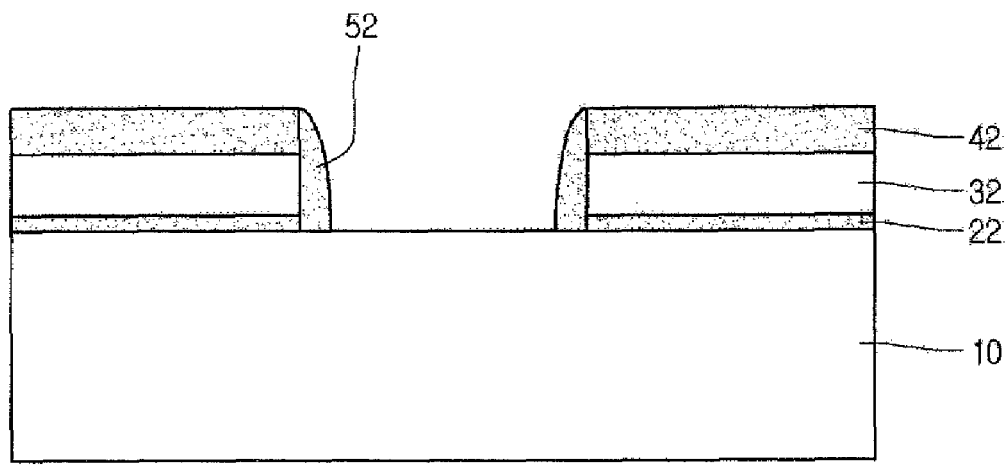

As illustrated in example FIG. 4, an etching process may then be performed with respect to second oxide layer 50, thereby forming spacer 52 on and/or over sidewalls of first oxide layer pattern 42, nitride pattern 32, and pad oxide layer pattern 22. Spacer 52 may have a thickness in the range of between 50 to 1000 Å.

Figure 5:
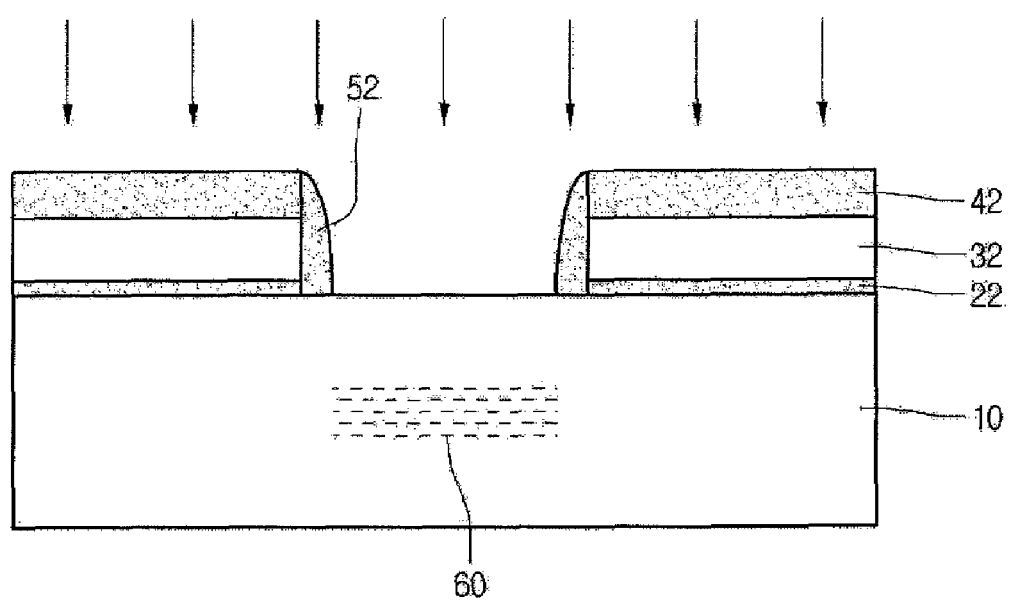

As illustrated in example FIG. 5, an ion implantation process may then be performed using first oxide layer pattern 42 and spacer 52 as masks, thereby forming ion layer 60 in semiconductor substrate 10. The ion implantation process may be performed using at least one of one of $F^+$, $Cl^+$, $Br^+$ and $I^+$ as a source with a dosage amount of in the range of between $1\times10^{10}$ [atoms/cm$^2$] to $1\times10^{18}$ [atoms/cm$^2$] at energy in the range of between 10 Kev to 120 KeV. Ion layer 60 may be formed at a depth in the range of between 1000 to 4000 Å from the uppermost surface of semiconductor substrate 10. Ion layer 60 may be formed to adjust the depth of a trench to be formed in a subsequent step.

Figure 6:
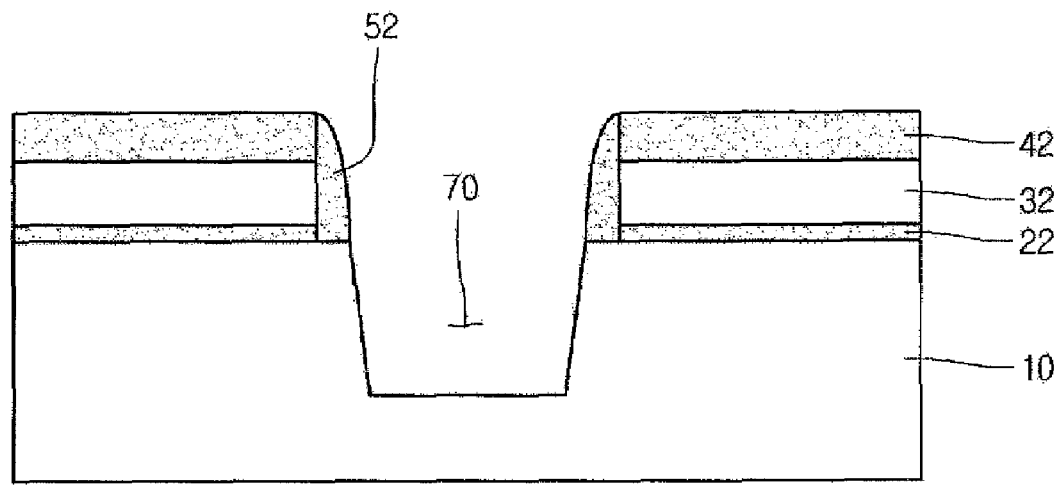

As illustrated in example FIG. 6, semiconductor substrate 10 may then be etched, thereby forming first trench 70 therein. The etching process to form first trench 70 may be performed by injecting a mixture of a combination of $Cl_2$, $BCl_3$, and $SF_6$ as a main etch gas and at least one of Ar, $O_2$, $N_2$ and He as an additive gas. When ions are implanted in order to form ion layer 60, defects may occur in the lattice of semiconductor substrate 10, and an etch rate increases in the etching process to form first trench 70. In addition, if an etching process is performed at a point of ion layer 60, ions implanted into ion layer 60 may serve as etch gas, so that an etch rate is rapidly increased. In this case, an etch end point can be obtained by measuring the etch rate through optical emission spectroscopy. By obtaining the etch end point as described above, the depth of first trench 70 can be adjusted. Accordingly, a predetermined trench etching depth can be obtained, so that the characteristic of a device can be improved. Spacer 52 may be removed during the etching process.

Figure 7:
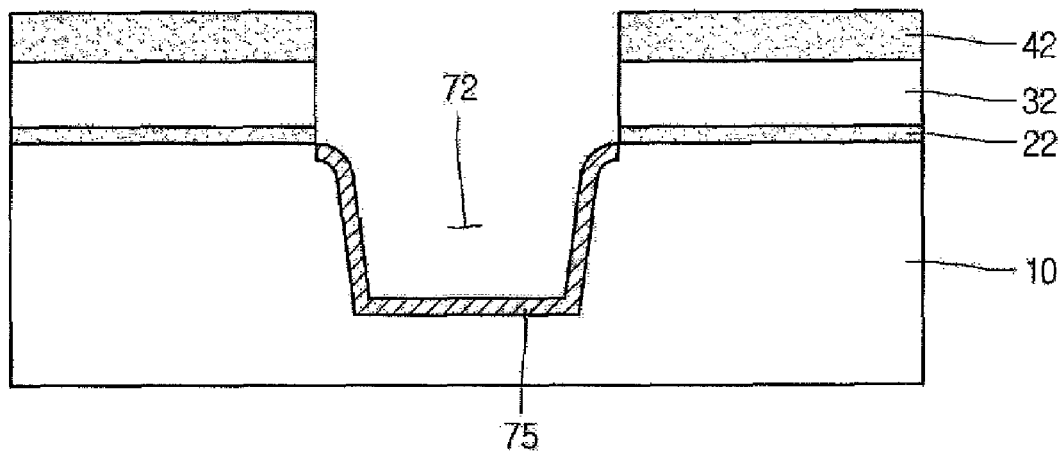

As illustrated in example FIG. 7, an oxidation process may then be performed with respect to semiconductor substrate 10, thereby forming second trench 72 that is obtained by rounding an upper edge of first trench 70. The oxidation process may be performed by using a furnace. Through the oxidation process, thermal oxidation layer 75 may be formed in an exposed portion of first trench 70. The edge of first trench 70, on which energy is concentrated, may become rounded. Since second trench 72 having a rounded edge may be formed through the oxidation process, a hump phenomenon, which causes degradation of a characteristic of a transistor due to an electric field concentrated on an edge of a trench, can be prevented. Accordingly, the insulating characteristics between devices can be improved.

Figure 8:
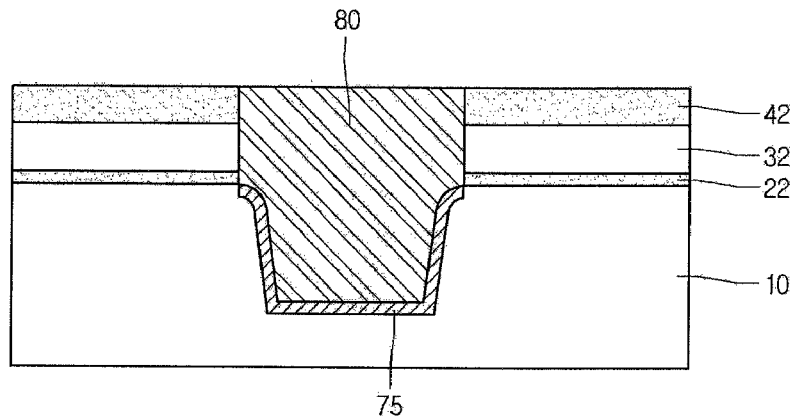

As illustrated in example FIG. 8, an insulating material may then be provided on and/or over semiconductor substrate 10 including thermal oxidation layer 75 in second trench 72, and also on and/or over sidewalls of first oxide layer pattern 42, nitride pattern 32, and pad oxide layer pattern 22. A CMP process may then be performed with respect to the resultant structure, thereby forming insulating layer 80. Insulating layer 80 may be formed through the CMP process using nitride layer pattern 32 as an etch stop layer after the insulating material is provided on and/or over semiconductor substrate 10. Insulating layer 80 may be composed of at least one of tetra ethyl ortho silicate (TEOS), undoped silicate glass (USG) and high density plasma (HDP) oxide layers.

Figure 9:
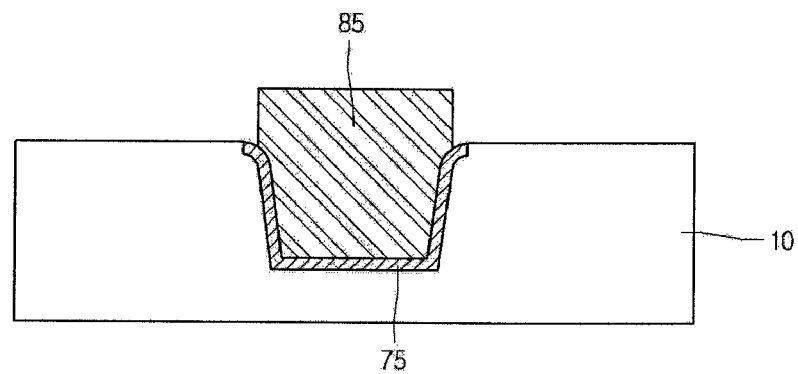

As illustrated in example FIG. 9, first oxide layer pattern 42, nitride layer pattern 32 and pad oxide layer pattern 22 may then be removed through an etching process. A cleaning process may then be performed to remove foreign matter and debris generated in the etching process, thereby forming isolation layer 85 formed on and/or over thermal oxidation layer 75 in second trench 72. In the etching and cleaning processes, an exposed portion of insulating layer 80 may be partially removed, thereby forming isolation layer 85. Isolation layer 80 may include a portion which protrudes from second trench 72 and above the uppermost surface of semiconductor substrate 10.

Figure 10:
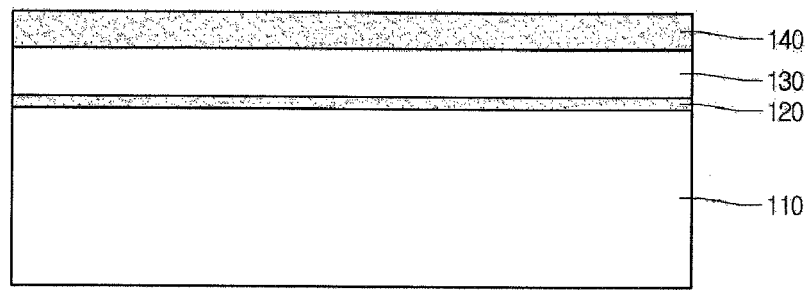

As illustrated in example FIG. 10, a method of manufacturing a semiconductor device in accordance with embodiments may include sequentially forming pad oxide layer 120, nitride layer 130 and oxide layer 140 on and/or over semiconductor substrate 110. Pad oxide layer 120 may have a thickness in the range between 30 to 500 Å, nitride layer 130 may have a thickness in the range between 500 to 3000 Å and first oxide layer 140 may have a thickness in the range between 300 to 2000 Å. Pad oxide layer 120 may serve to protect elements formed on and/or over semiconductor substrate 110. Nitride layer 130 may be composed of at least one of an SiN layer and an oxynitride layer.

Figure 11:
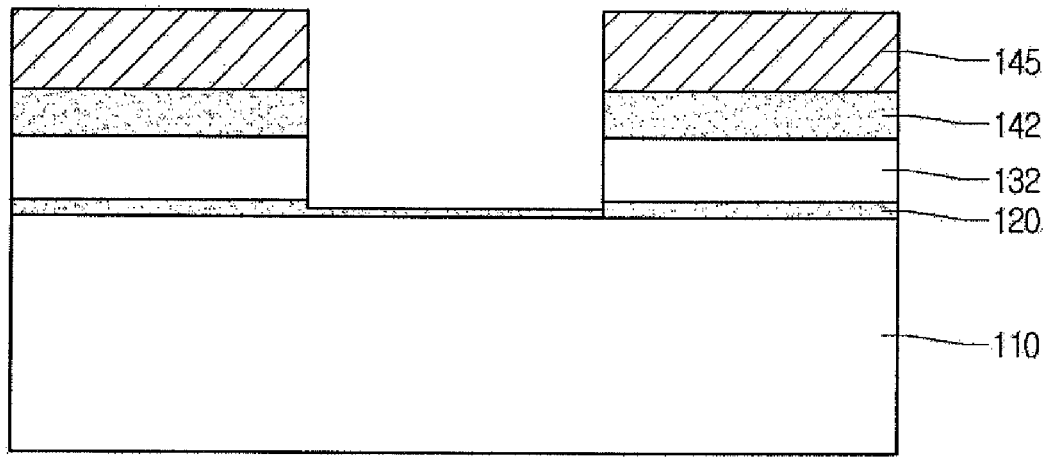

As illustrated in example FIG. 11, after forming photoresist pattern 145 on and/or over oxide layer 140, an etching process may be performed with respect to the resultant structure, thereby forming nitride layer pattern 132 and oxide layer pattern 142 on and/or over pad oxide layer 120. A portion of pad oxide layer 120 may then be etched to reduce the thickness of pad oxide layer 120 in the range between 10 to 30 Å. The etching process may be performed by injecting a mixture including $C_xH_yF_z$ gas as a main etch gas and at least one of $SF_6$, $Cl_2$, $N_2$, $O_2$, HBr, Ar and He as an additive gas.

Figure 12:
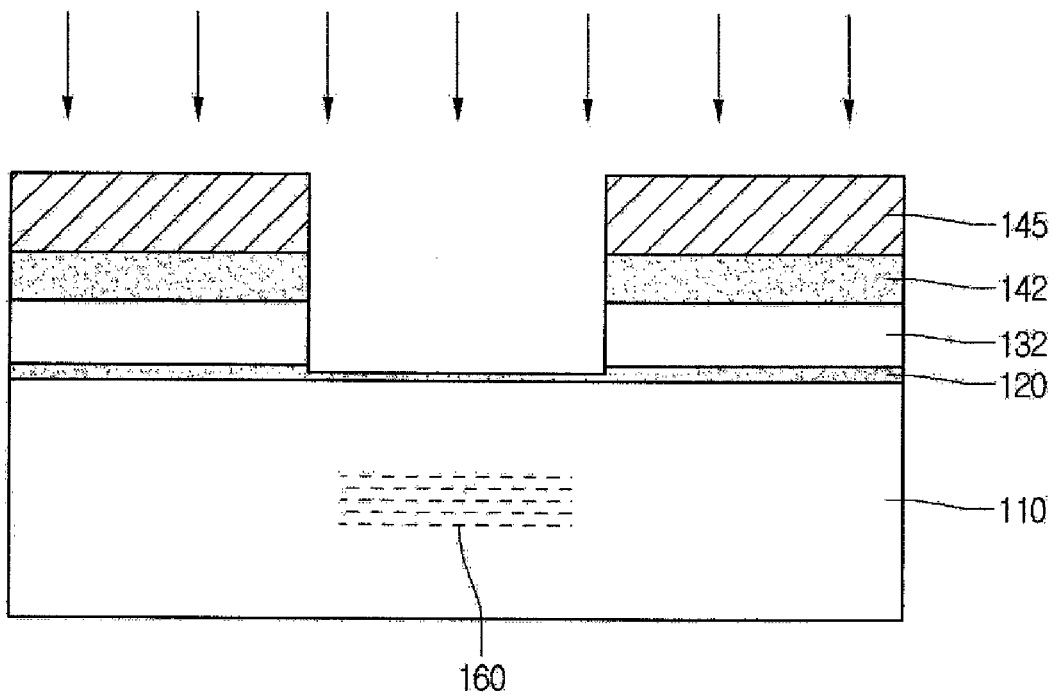

As illustrated in example FIG. 12, a blanket ion implantation process may then be performed with respect to oxide layer pattern 142 and pad oxide layer 120 on and/or over semiconductor substrate 110, thereby forming ion layer 160 in semiconductor substrate 110. The ion implantation process may be performed using at least one of a halogen element such as $F^+$, $Cl^+$, $Br^+$ and $I^+$ as a source with a dosage amount of dose in the range between $1\times10^{10}$ [atoms/cm$^2$] to $1\times10^{18}$ [atoms/cm$^2$] at energy in the range between 10 Kev to 120 KeV. In addition, ion layer 160 may be formed at a depth in the range between 1000 to 4000 Å from the uppermost surface of semiconductor substrate 10. Ion layer 160 may be formed in order to adjust the depth of a trench to be formed in a subsequent process. Subsequently, photoresist pattern 145 may then be removed through an ashing process.

Figure 13:
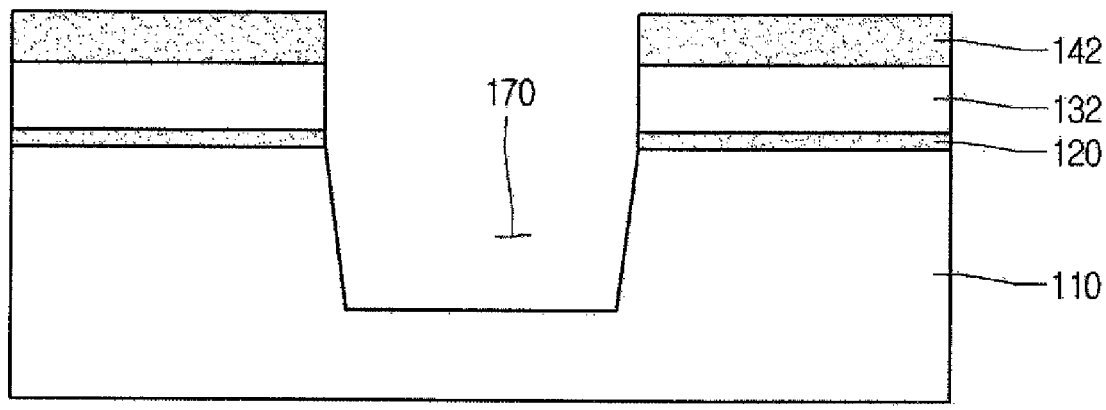

As illustrated in example FIG. 13, pad oxide layer 120 and semiconductor substrate 110 may then be etched, thereby forming trench 170 and pad oxide layer pattern 120. The etching process for forming trench 170 may be performed by injecting a mixture including a combination of $Cl_2$, $BCl_3$ and $SF_6$ as a main etch gas and at least one of Ar, $O_2$, $N_2$ and He as an additive gas. When ions are implanted in order to form ion layer 160, defects may occur in the lattice of semiconductor substrate 110, and an etch rate may increase in the etching process to form trench 170. In addition, if an etching process is performed at a point of ion layer 60, ions implanted into ion layer 60 may serve as an etch gas, so that an etch rate is rapidly increased. In this case, an etch end point can be obtained by measuring the etch rate through optical emission spectroscopy. The etch end point may be obtained as described above, so that the depth of trench 170 can be adjusted. Accordingly, a predetermined trench etching depth can be ensured, so that the characteristic of a device can be improved. Subsequently, oxide layer pattern 142 may then be removed through an ashing process.

Figure 14:
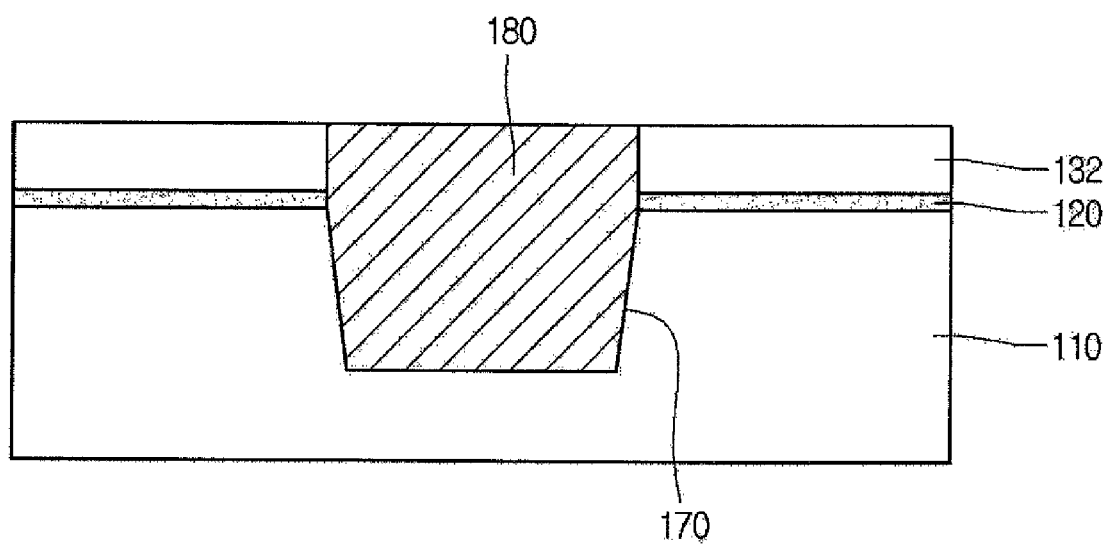

As illustrated in example FIG. 14, an insulating material may be formed on and/or over semiconductor substrate 110 including trench 170. A CMP process may then be performed, thereby forming insulating layer 180 in trench 170 and on and/or over sidewalls of nitride layer pattern 132 and pad oxide layer pattern 120. Insulating layer 180 may be formed through the CMP process using nitride layer pattern 132 as an etch stop layer after the insulating material is provided on and/or over semiconductor substrate 110. Insulating layer 180 may be composed of at least one of TEOS, USG and HDP oxide layers.

Figure 15:
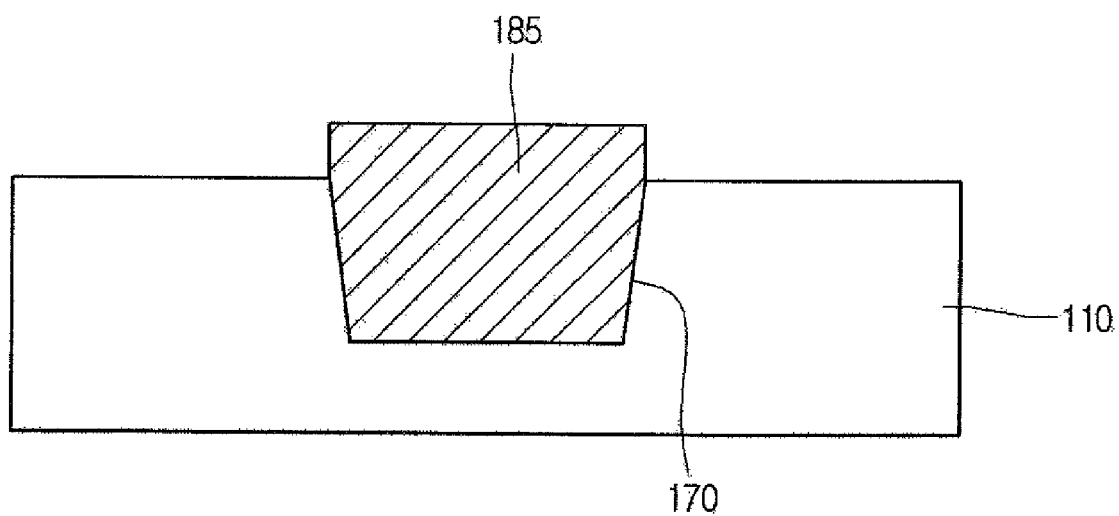

As illustrated in example FIG. 15, nitride layer pattern 132 and pad oxide layer pattern 120 may then be removed through an etching process. A cleaning process may then be performed to remove foreign matter and debris generated during the etching process, so that isolation layer 185 can be formed. In the etching and cleaning processes, an exposed portion of insulating layer 180 may be partially removed, thereby forming isolation layer 185. Isolation layer 180 may include a portion which protrudes from trench 170 and above the uppermost surface of semiconductor substrate 110.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a pad oxide layer and an insulating layer on a semiconductor substrate and then
    performing a first etching process on the semiconductor device to form an insulating layer pattern exposing a portion of the pad oxide layer in a trench area; and then
    performing a second etching process with respect to the pad oxide layer by using the insulating layer pattern as a mask; and then
    performing a blanket ion implantation process with respect to the insulating layer pattern and the exposed portion of the pad oxide layer to form an ion layer in the semiconductor substrate; and then
    performing a third etching process with respect to the semiconductor substrate to simultaneously form a pad oxide layer pattern and a trench in the semiconductor substrate, wherein performing the third etching processes comprises using ions from the ion layer as an etching gas; and then
    forming an insulating layer on the semiconductor substrate including the trench; and then
    performing a planarization process with respect to the semiconductor substrate including the insulating material and removing the pad oxide layer pattern and the insulating layer pattern, thereby forming an isolation layer in the trench.

2. The method of claim 1, wherein the insulating layer comprises an oxide layer.

3. The method of claim 2, wherein the oxide layer comprises at least one of tetra ethyl ortho silicate (TEOS), undoped silicate glass (USG) and high density plasma (HDP) oxide layers.

4. The method of claim 1, wherein the exposed portion of the pad oxide layer has a thickness in a range between 10 to 30 Å.

5. The method of claim 1, wherein the ion layer comprises a halogen element.

6. The method of claim 5, wherein the halogen element comprises at least one of $F^+$, $Cl^+$, $Br^+$ and $I^+$.

7. The method of claim 1, wherein performing the blanket ion implantation process comprises:
    performing the blanket ion implantation process implanting ions of a halogen element a source at a dosage amount in a range between $1\times10^{10}$ [atoms/cm$^2$] to $1\times10^{19}$ [atoms/cm$^2$] and at energy in a range between 10 Kev to 120 KeV.

8. The method of claim 7, wherein the halogen element comprises at least one of $F^+$, $Cl^+$, $Br^+$ and $I^+$.

9. The method of claim 1, wherein the ion layer is formed at a depth of in a range between 500 to 5000 Å from the uppermost surface of the semiconductor substrate.

10. The method of claim 1, wherein performing the third etching process comprises:
    injecting a mixture including a combination of $Cl_2$, $BCl_3$ and $SF_6$ as a main etch gas and at least one of Ar, $O_2$, $N_2$ and He as an additive gas.

11. The method of claim 1, further comprising, after performing the planarization process, performing a cleaning process with respect to the semiconductor substrate.

12. The method of claim 11, further comprising, after performing the cleaning process, removing a portion of the isolation layer exposed during the cleaning process.

13. The method of claim 1, wherein performing the planarization process comprises: using the insulating layer pattern as an etch stop layer.

14. A method comprising:
    sequentially forming a first oxide layer, a nitride layer and a second oxide layer on a semiconductor substrate; and then
    performing a first etching process to expose a portion of the semiconductor substrate to thereby form a first oxide layer pattern, a nitride layer pattern and a second oxide layer pattern on the semiconductor substrate; and then
    forming a third oxide layer on the semiconductor substrate including the first oxide layer pattern, the nitride layer pattern and the third oxide layer pattern; and then
    performing a second etching process to expose a portion of the semiconductor substrate to thereby form a spacer on sidewalls of the first oxide layer pattern, the nitride layer pattern and the third oxide layer pattern; and then performing an ion implantation process using the second oxide layer pattern and the spacer as masks to thereby form an ion layer in the semiconductor substrate; and then performing a third etching process using ions from the ion layer as an etching gas to thereby form a trench in the semiconductor substrate, wherein the depth of trench is adjusted using the ion layer; and then forming a fourth oxide layer on the semiconductor substrate and in the trench and also on sidewalls of the first oxide layer pattern, the nitride layer pattern and the second oxide layer pattern; and then performing as fourth etching process to thereby remove the first oxide layer pattern, the nitride layer pattern and the second oxide layer pattern; and then performing a cleaning process with respect to the semiconductor substrate.

15. The method of claim 14, wherein the ion layer is formed at a depth in a range between 1000 to 4000 Å from the uppermost surface of semiconductor substrate.

16. The method of claim 14, further comprising, after performing the third etching process:

performing an oxidation process with respect to semiconductor substrate to simultaneously form a second trench and a thermal oxidation layer formed on the second trench.

17. The method of claim 14, wherein performing the third etching process comprises removing the spacer.

18. The method of claim 14, wherein the ion layer is formed at a depth of in a range between 500 to 5000 Å from the uppermost surface of the semiconductor substrate.

19. A method comprising:

sequentially forming a first oxide layer, a nitride layer and a second oxide layer on a semiconductor substrate; and then performing a first etching process to expose a portion of the first oxide layer and thereby form a nitride layer pattern and a second oxide layer pattern on the semiconductor substrate; and then performing an ion implantation process to form an ion layer at a predetermined depth in the semiconductor substrate; and then performing a second etching process using ions from the ion layer as an etching gas to thereby form a trench in the semiconductor substrate and a first oxide layer pattern; and then removing the second oxide layer pattern; and then forming a third oxide layer on the semiconductor substrate and in the trench and also on sidewalls of the first oxide layer pattern and the nitride layer pattern; and then performing as third etching process to thereby remove the first oxide layer pattern and the nitride layer pattern; and then performing a cleaning process with respect to the semiconductor substrate.

* * * * *